(12) United States Patent
Baek et al.

(10) Patent No.: US 10,050,032 B2
(45) Date of Patent: *Aug. 14, 2018

(54) SYSTEM ON CHIP

(71) Applicant: SAMSUNG ELECTRONICS CO., LTD., Suwon-si (KR)

(72) Inventors: Sang-Hoon Baek, Seoul (KR); Sun-Young Park, Hwaseong-si (KR); Sang-Kyu Oh, Gwacheon-si (KR); Ha-Young Kim, Seoul (KR); Jung-Ho Do, Yongin-si (KR); Moo-Gyu Bae, Incheon (KR); Seung-Young Lee, Incheon (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/416,016

(22) Filed: Jan. 26, 2017

(65) Prior Publication Data
US 2017/0133367 A1 May 11, 2017

Related U.S. Application Data

(63) Continuation of application No. 14/872,774, filed on Oct. 1, 2015, now Pat. No. 9,589,955.

(30) Foreign Application Priority Data

Apr. 22, 2015 (KR) .................... 10-2015-0056266

(51) Int. Cl.
H01L 23/48 (2006.01)
H01L 29/40 (2006.01)
(Continued)

(52) U.S. Cl.
CPC .... *H01L 27/088* (2013.01); *H01L 21/823431* (2013.01); *H01L 21/823475* (2013.01);
(Continued)

(58) Field of Classification Search
CPC ............ H01L 23/5226; H01L 27/0688; H01L 21/8221
(Continued)

(56) References Cited

U.S. PATENT DOCUMENTS 5,072,286 A 12/1991 Minami et al.
6,414,359 B1 7/2002 Madan
(Continued)

OTHER PUBLICATIONS

Office Action issued in parent U.S. Appl. No. 14/872,774 dated Aug. 16, 2016.
(Continued)

*Primary Examiner* — Theresa T Doan
(74) *Attorney, Agent, or Firm* — Sughrue Mion, PLLC

(57) ABSTRACT

Systems on chips are provided. A system on chip (SoC) includes a first gate line, a second gate line and a third gate line extending in a first direction, a gate isolation region cutting the first gate line, the second gate line and the third gate line and extending in a second direction across the first direction, a first gate contact formed on the second gate line arranged between the first gate line and the third gate line, and electrically connecting the cut second gate line, a second gate contact formed on the first gate line, a third gate contact formed on the third gate line, a first metal line electrically connecting the second gate contact and the third gate contact, and a second metal line electrically connected to the first gate contact.

15 Claims, 16 Drawing Sheets

Related U.S. Application Data

(60) Provisional application No. 62/058,291, filed on Oct. 1, 2014.

(51) Int. Cl.
*H01L 27/088* (2006.01)
*H01L 23/528* (2006.01)
*H01L 27/02* (2006.01)
*H01L 27/11* (2006.01)
*H01L 21/8234* (2006.01)

(52) U.S. Cl.
CPC ........ *H01L 23/528* (2013.01); *H01L 27/0207* (2013.01); *H01L 27/0886* (2013.01); *H01L 27/1104* (2013.01)

(58) Field of Classification Search
USPC ....................................................... 257/774
See application file for complete search history.

(56) References Cited

U.S. PATENT DOCUMENTS

| | | | |
|---|---|---|---|
| 6,856,001 B2 * | 2/2005 | Rhodes | H01L 21/76237 257/292 |
| 7,915,691 B2 | 3/2011 | Wong et al. | |
| 8,258,578 B2 | 9/2012 | Carlson | |
| 8,446,175 B2 | 5/2013 | Aton | |
| 8,595,661 B2 | 11/2013 | Kawa et al. | |
| 8,653,630 B2 | 2/2014 | Liaw et al. | |
| 8,679,911 B2 | 3/2014 | Wang et al. | |
| 8,741,763 B2 | 6/2014 | Ma et al. | |
| 8,847,329 B2 | 9/2014 | Becker et al. | |
| 9,589,955 B2 * | 3/2017 | Baek | H01L 27/088 |
| 2006/0138561 A1 * | 6/2006 | Seo | H01L 21/76816 257/382 |
| 2014/0027918 A1 | 1/2014 | Rashed et al. | |
| 2014/0264629 A1 | 9/2014 | Zhu et al. | |

OTHER PUBLICATIONS

Notice of Allowance issued in parent U.S. Appl. No. 14/872,774 dated Oct. 21, 2016.

* cited by examiner

FIG. 1

| 10_1 | 10_2 | 10_3 | 10_4 | 10_5 | 10_6 | 10_7 | 10_8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) || SA/WD(20_2) || SA/WD(20_3) || SA/WD(20_4) ||
| PERIPHERY(30) |||||||||
| SA/WD(20_8) || SA/WD(20_7) || SA/WD(20_6) || SA/WD(20_5) ||
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

SYSTEM ON CHIP

CROSS-REFERENCE TO RELATED APPLICATION

This application is a continuation of U.S. application Ser. No. 14/872,774 filed Oct. 1, 2015, which claims the benefit of Provisional Application No. 62/058,291 filed on Oct. 1, 2014 and priority from Korean Patent Application No. 10-2015-0056266 filed on Apr. 22, 2015 in the Korean Intellectual Property Office, the disclosures of which are incorporated herein by reference in its entirety.

BACKGROUND

1. Technical Field

Exemplary embodiments relate to a system on chip (SoC), more particularly, to and SOC comprising a gate contact structure.

2. Description of the Related Art

Multigate transistors have been suggested as one of the scaling technologies to increase density of a semiconductor device, in which a multichannel active pattern (or silicon body) in a fin or nanowire form is formed on a substrate, and then gates are formed on a multichannel active pattern surface.

Because the multigate transistor uses a three-dimensional channel, scaling is facilitated. Further, electric current control ability can be enhanced without having to increase lengths of the gates of the multigate transistor. Furthermore, it is possible to effectively control short channel effect (SCE) in which electric potential in channel region is influenced by the drain voltage.

SUMMARY

One or more exemplary embodiments provide a system on chip (SoC) having a 3-contacted poly pitch (3CPP) cross coupling node, using a gate contact structure.

The objectives addressed by the exemplary embodiments may not be limited to those mentioned above, and accordingly, other objectives that are not mentioned herein would be clearly understandable to those skilled in the art based on the description provided below.

According to an aspect of an exemplary embodiment, there is provided a system on chip (SoC) including a first gate line, a second gate line and a third gate line extending in a first direction, a gate isolation region cutting the first gate line, the second gate line and the third gate line and extending in a second direction across the first direction, a first gate contact formed on the second gate line arranged between the first gate line and the third gate line, and electrically connecting the cut second gate line, a second gate contact formed on the first gate line, a third gate contact formed on the third gate line, a first metal line electrically connecting the second gate contact and the third gate contact, and a second metal line electrically connected to the first gate contact.

According to an aspect of another exemplary embodiment, there is provided a system on chip (SoC) including a first active fin and a second active fin extended in a first direction and spaced apart from each other in a second direction across the first direction, a first gate line, a second gate line and a third gate line extended in the second direction, on the first active fin and the second active fin, a gate isolation region extended in the first direction between the first active fin and the second active fin, the gate isolation region cutting the first gate line, the second gate line and the third gate line, a first gate contact extended in the second direction on the second gate line arranged between the first gate line and the third gate line, and electrically connecting the cut second gate line, a second gate contact formed on the first gate line at an intersection area between the first active fin and the first gate line, a third gate contact formed on the third gate line at an intersection area between the second active fin and the third gate line, a first metal line electrically connecting the second gate contact and the third gate contact, and a second metal line electrically connected to the first gate contact.

According to an aspect of another exemplary embodiment, there is provided a system on chip (SoC) including a first gate line and a second gate line extended in a first direction, a gate isolation region cutting the first gate line and the second gate line and extended in a second direction across the first direction, a first gate contact formed on the cut first gate line and electrically connecting the cut first gate line, a second gate contact formed on the second gate line, a first via structure formed on the first gate contact, a second via structure formed on the second gate contact, and a metal line connecting the first via structure and the second via structure, and electrically connecting the first gate contact and the second gate contact.

According to an aspect of another exemplary embodiment, there is provided a system on chip (SoC) including: a first gate line, a second gate line and a third gate line extending in a first direction; a gate isolation region cutting the first gate line, the second gate line and the third gate line and extending in a second direction across the first direction; a first gate contact formed on the second gate line arranged between the first gate line and the third gate line, and electrically connecting the cut second gate line; and a second metal line electrically connected to the first gate contact.

BRIEF DESCRIPTION OF THE DRAWINGS

FIG. 1 is a block diagram and FIG. 2 is a circuit diagram, each illustrating a non-volatile memory device comprising a semiconductor device according to exemplary embodiments;

DETAILED DESCRIPTION OF EXEMPLARY EMBODIMENTS

Figure 2:
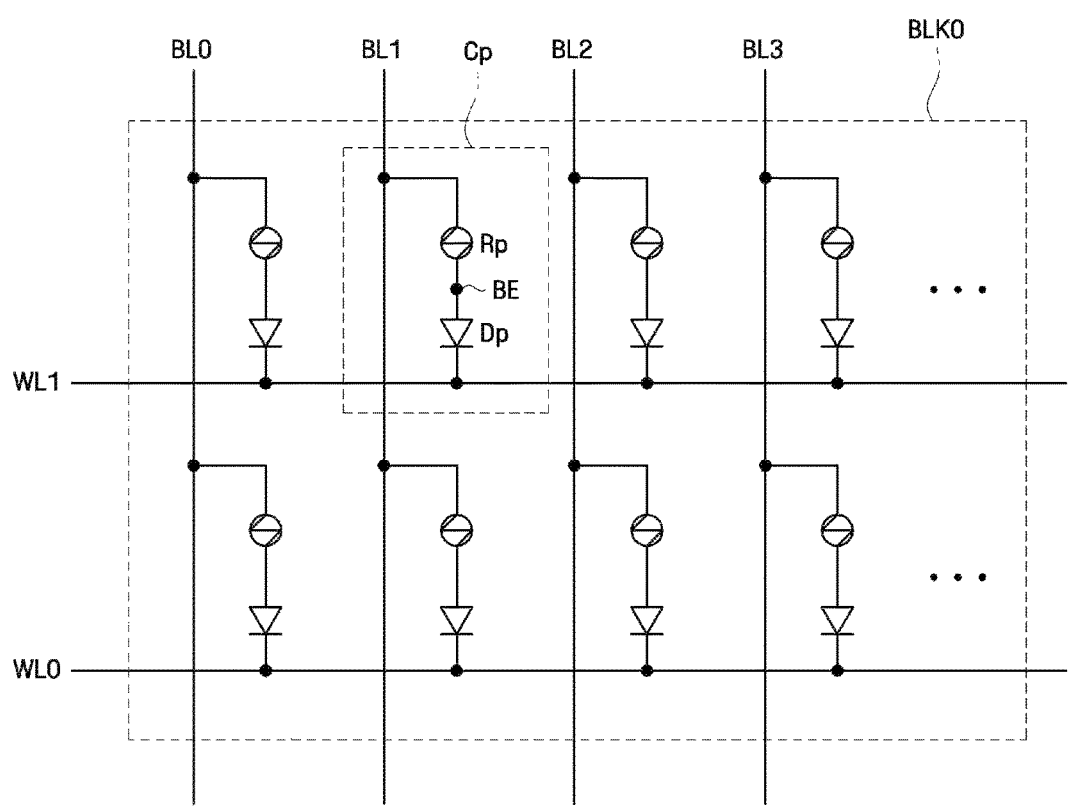

Exemplary embodiments will now be described more fully hereinafter with reference to the accompanying drawings. The exemplary embodiments may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the exemplary embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the exemplary embodiments belong. It is noted that the use of any and all examples, or exemplary terms provided herein is intended merely to better illuminate the exemplary embodiments and is not a limitation on the scope of the exemplary embodiments unless otherwise specified. Further, unless defined otherwise, all terms defined in generally used dictionaries may not be overly interpreted.

Exemplary embodiments will be described with reference to perspective views, cross-sectional views, and/or plan views. Thus, the profile of an exemplary view may be modified according to manufacturing techniques and/or allowances. That is, the exemplary embodiments not intended to limit the scope but cover all changes and modifications that can be caused due to a change in manufacturing process. Thus, regions shown in the drawings are illustrated in schematic form and the shapes of the regions are presented simply by way of illustration and not as a limitation.

FIG. 1 is a block diagram and FIG. 2 is a circuit diagram, each illustrating a non-volatile memory device comprising a semiconductor device according to exemplary embodiments. For convenience of explanation, 16 memory banks will be exemplified herein, although exemplary embodiments are not limited thereto. Also for convenience of explanation, in FIG. 2, regions related with a first memory block BLK0 will be mainly illustrated.

Referring first to FIG. 1, a non-volatile memory device including a semiconductor device according to exemplary embodiments includes a plurality of memory banks (10_1~10_16), a plurality of sense amplifiers and write drivers (20_1~20_8), and a peripheral circuit region 30.

The plurality of memory banks (10_1~10_16) may each include a plurality of memory blocks (BLK0~BLK7), and each of the memory blocks (10_1~10_16) includes a plurality of memory cells in a matrix arrangement. Referring to FIG. 1, memory blocks in 8×8 arrangement are exemplified, although exemplary embodiments are not limited thereto.

Further, row decoders and column decoders may be arranged to respectively designate rows and columns of a non-volatile memory cell for writing/reading corresponding to the memory banks (10_1~10_16).

The sense amplifiers and write drivers (20_1~20_8), which are arranged corresponding to two memory banks (10_1~10_16), perform read and write operations on the corresponding memory banks. As illustrated in FIG. 1, the sense amplifiers and write drivers (20_1~20_8) may correspond to two memory banks (10_1~10_16), but exemplary embodiments are not limited thereto. That is, the sense amplifiers and write drivers (20_1~20_8) may be arranged corresponding to one or four memory banks as well.

A plurality of logic circuits and voltage generators are arranged in the peripheral circuit region 30 to operate the row decoders, column decoders, sense amplifiers, or write drivers Referring to FIG. 2, a memory block BLK0 of a non-volatile memory device including a semiconductor device according to exemplary embodiments includes a plurality of memory cells Cp, a plurality of bit lines BL0~BL3, and a plurality of word lines WL0, WL1.

The plurality of memory cells Cp are positioned at intersection areas between the word lines WL0, WL1 and the bit lines BL0~BL3. The memory cells Cp change between crystalline state and amorphous state depending on tunneling current. The memory cells Cp include a variable resistor device Rp having different resistances in respective states and a vertical cell diode Dp which is connected to the variable resistor device Rp through a lower electrode BE. The vertical cell diode Dp controls the tunneling current flowing the variable resistor device Rp.

The variable resistor device Rp is configured as a phase change device, and may comprise a variety of materials including a compound of two elements such as GaSb, InSb, InSe, $Sb_2Te_3$, GeTe, a compound of three elements such as GeSbTe, GaSeTe, InSbTe, $SnSb_2Te_4$, InSbGe, or a compound of four elements such as AgInSbTe, (GeSn)SbTe, GeSb(SeTe), $Te_{81}Ge_{15}Sb_2S_2$, etc.

For example, the variable resistor device Rp may include GeSbTe comprising of germanium (Ge), antimony (Sb), and tellurium (Te). It is possible that the variable resistor device Rp is coupled with the bit lines BL0~BL3, and the vertical cell diode Dp is coupled with the word lines WL0, WL1, as illustrated in FIG. 2, and vice versa. That is, the variable resistor device Rp may be coupled with the word lines WL0, WL1, and the vertical cell diode Dp may be coupled with the bit lines BL0~BL3.

Hereinafter, operation of a non-volatile memory device will be explained with reference to FIG. 2.

First, for a write operation of the non-volatile memory device, the variable resistor device Rp may be heated to a melting temperature Tm or above and cooled down rapidly, which will result in amorphous state with logic level 1, or the variable resistor device Rp may be heated to a temperature equal to or greater than a crystallization temperature Tx and equal to or less than a melting temperature Tm, maintained at that temperature for a predetermined time period, and cooled down, which will result in crystalline state with logic level 0.

For phase change of the variable resistor device Rp, write current of considerably high level is passed through the variable resistor device Rp. For example, approximately 1 mA of write current may be provided to reset, and approximately 0.6 to 0.7 mA of write current may be provided to set. The write current provided from a write circuit (not illustrated) passes through the bit lines BL0~BL3 and flows out as ground voltage.

For a read operation of the non-volatile memory device, a read current in such a level that does not cause phase change of the variable resistor device Rp is provided to the variable resistor device Rp, in order to read stored data. The read current provided from a read circuit passes through the bit lines BL0~BL3 and the vertical cell diode Dp and flows out as ground voltage.

Figure 3:
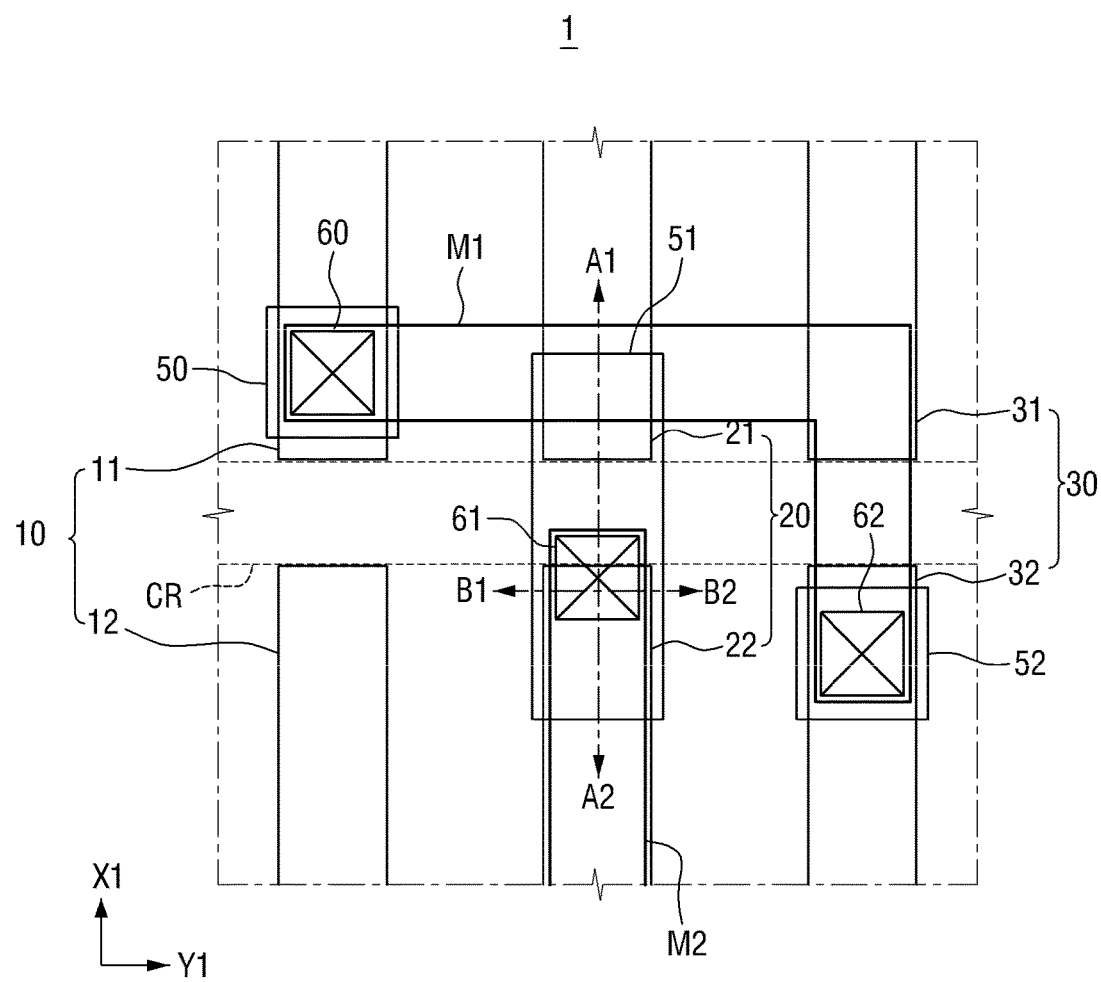
FIG. 3 is a layout provided to explain a semiconductor device according to an exemplary embodiment.
Figure 4:
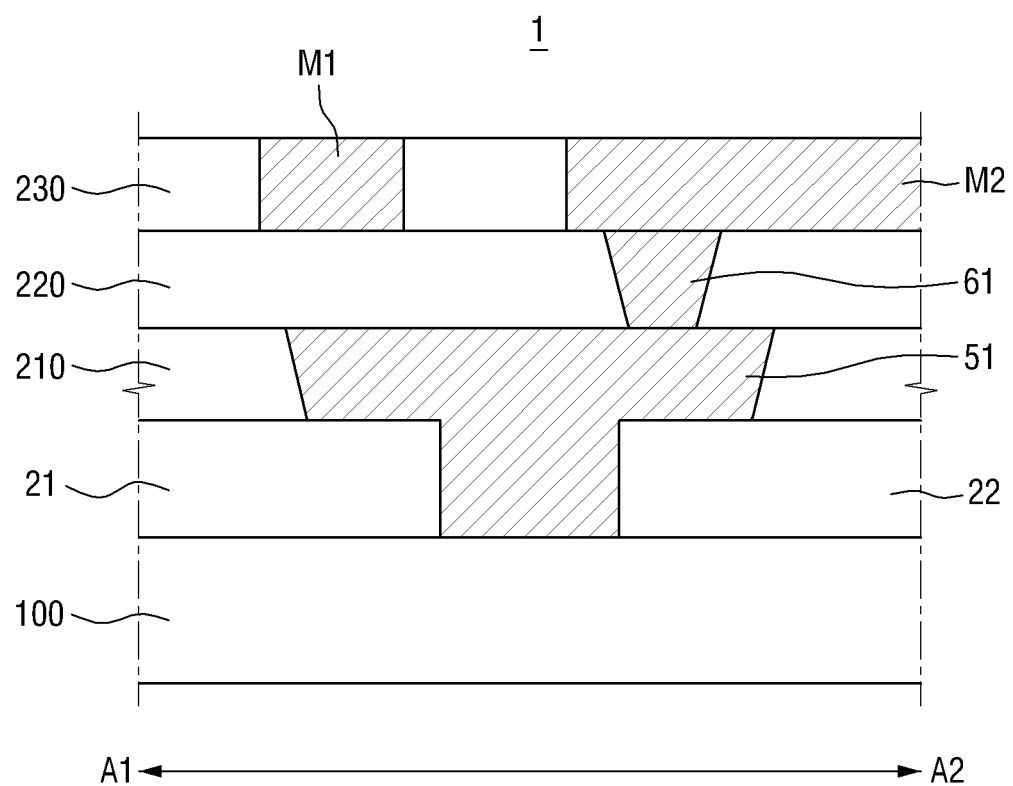
FIG. 4 is a cross section taken on line A1-A2 of FIG. 3.
Figure 5:
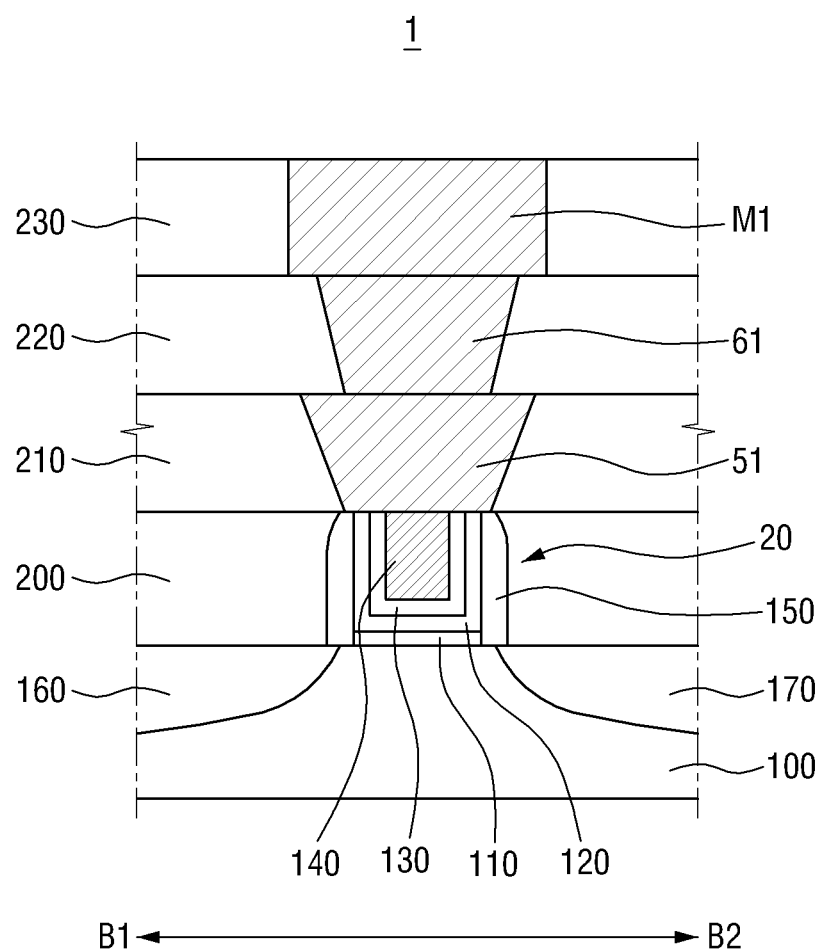
FIG. 5 is a cross section taken on line B1-B2 of FIG. 3.

FIG. 3 is a layout provided to explain a semiconductor device according to an exemplary embodiment; FIG. 4 is a cross section taken on line A1-A2 of FIG. 3. FIG. 5 is a cross section taken on line B1-B2 of FIG. 3.

In order to use cross coupling nodes, the cross coupling nodes are connected with two gate lines. In this case, insufficient volume of a source or a drain acts as a limit to the stress effects of a strained source or drain.

In an exemplary embodiment, performance of a semiconductor device can be enhanced by forming cross coupling nodes in 3CPP, without using a special cross-coupling construct. According to an exemplary embodiment, gate lines exceeding 3CPP may be cut, and electric connection of the cut gate lines may be facilitated. Further, according to an exemplary embodiment, a transistor, which can reduce complexity of the cross coupling node structure and which uses a plurality of sources or drains may be implemented. Further, according to an exemplary embodiment, using a vertical gate contact can simplify the process and structure for back-end-of-line (BEOL) connection.

Referring to FIGS. 3 through 5, a semiconductor device 1 includes a first gate line 10, a second gate line 20, a third gate line 30, a gate isolation region CR, a first gate contact 50, a second gate contact 51, a third gate contact 52, a first via structure 60, a second via structure 61, a third via structure 62, a first metal line M1, and a second metal line M2.

The first through the third gate lines 10, 20, 30 are extended in a first direction X1. The first through the third gate lines 10, 20, 30 may include substantially the same configuration. The first through the third gate lines 10, 20, 30 have a structure cut by the gate isolation region CR. The gate isolation region CR is formed, extending in a second direction Y1, and cutting the first through the third gate lines 10, 20, 30.

That is, the first gate line 10 includes first sub gate lines 11, 12, the second gate line 20 includes second sub gate lines 21, 22, and the third gate line 30 includes third sub gate lines 31, 32.

First, the second gate line 20 will be explained with reference to FIG. 3. The second gate line 20 will be representatively explained herein, since the first gate line 10 and the third gate line 30 have substantially the same configuration as the second gate line 20.

The second gate line 20 is formed on a substrate 100.

The substrate 100 may be a rigid substrate such as silicon substrate, silicon on insulator (SOI) substrate, gallium arsenide substrate, silicon germanium substrate, ceramic substrate, quartz substrate or glass substrate for display, or a flexible substrate such as polyimide, polyester, polycarbonate, polyethersulfone, polymethyl methacrylate, polyethylene naphthalate, or polyethylene terephthalate.

The second gate line 20 includes an interface layer 110, a high-k layer 120, a workfunction adjustment layer 130, a gate metal 140, or a gate spacer 150.

The interface layer 110 may be formed by oxidizing an upper surface of the substrate 100. However, the exemplary embodiments are not limited to above. The interface layer 110 may play a role of preventing interface defect between the substrate 100 and the high-k layer 120. The interface layer 110 may include low-k dielectric material layer having a dielectric constant (k) of 9 or below, for example, silicon oxide layer (SiO2, k is approximately 4) or silicon oxynitride layer (depending on oxygen atom and nitrogen atom contents, k is approximately 4~8). Alternatively, the interface layer 110 may be formed from silicate, and may be formed of a combination of the layers exemplified above.

The high-k layer 120 may be formed from a high-k material having higher dielectric constant than the interface layer 110. In one or more exemplary embodiments, said high-k layer 120 may be formed from materials such as HfO2, Al2O3, ZrO2, TaO2, but not limited thereto. The high-k layer 120 may be conformably formed to fill in a space in the gate spacer 150. The high-k layer 120 may be formed into a suitable thickness according to a type of device desired to be formed.

The workfunction adjustment layer 130 may be formed on the high-k layer 120. The workfunction adjustment layer 130 may be formed in contact with the high-k layer 120. The workfunction adjustment layer 130 is used for the adjustment of workfunction. The workfunction adjustment layer 130 may include a metal nitride, for example. Specifically, the workfunction adjustment layer 130 may include at least one of Mo, Pd, Ru, Pt, TiN, WN, TaN, Ir, TaC, RuN, TiAl, TaAlC, TiAlN, and MoN. To be more specific, the workfunction adjustment layer 130 may be formed as a single layer comprising of TiN, or a double layer comprising of a TiN lower layer and a TaN upper layer, but not limited thereto. The workfunction adjustment layer 130 may also be extended along a sidewall of the gate spacer 150 to an upward direction.

The gate metal 140 may be formed on the workfunction adjustment layer 130. The gate metal 140 may be formed in contact with the workfunction adjustment layer 130, as illustrated. That is, the gate metal 140 may be formed so as to fill a space generated by the workfunction adjustment layer 130. The gate metal 140 may include a conductive material such as W or Al, but not limited thereto.

The gate spacer 150 may be formed on at least one of side surfaces of the second gate line 20. The gate spacer 150 may include at least one of nitride layer, oxynitride layer, and low-k material. Although one side surface of the gate spacer 150 is illustrated as a curved line, exemplary embodiments are not limited to this example only. Accordingly, the shape of the gate spacer 150 may vary. For example, differently from the illustration, the shape of the gate spacer 150 may be I-shaped or L-shaped. As illustrated in the drawings, the gate spacer 150 may be formed of a single layer, but not limited thereto. Accordingly, the gate spacer 150 may be formed of a plurality of layers.

Source or drain regions 160, 170 may be arranged on both sides of the second gate line 20, within the substrate 100. The source or drain regions 160, 170 may be n-type source or drain doped with n-type impurity. The source or drain regions 160, 170 may be in a low doped drain (LDD) form, but not limited thereto. The shape of the source or drain regions 160, 170 may vary depending on a type of the device.

For example, the substrate 100 may include a cell array region defining a plurality of memory cells, and a peripheral circuit region in which a plurality of logic circuit blocks and voltage generators or the like are arranged. The semiconductor device 1 may be a part of constituent elements such as the logic circuit blocks or the voltage generators arranged in the peripheral circuit region.

A driving device such as a driving transistor may be provided in the peripheral circuit region to drive the memory cell array region, on an active region defined by a device isolating layer. This driving transistor may be the semiconductor device 1 in an exemplary embodiment.

A first and a second metal lines M1, M2 corresponding to the bit lines BL may be formed in the peripheral circuit region. The second metal line M2 may be electrically connected to the second gate line 20. The bit lines BL and the first and the second metal lines M1, M2 may be formed as metal thin films. The word lines WL may be provided in or on the substrate 100, and may be a semiconductor layer doped with n-type impurity, for example.

If the word lines WL are formed as a semiconductor layer, such semiconductor layer for use as the word lines may be formed by doping an impurity on a predetermined region of the substrate 100, or by forming an epitaxial semiconductor layer on the substrate 100, and then doping the epitaxial semiconductor layer with impurity, or by forming an epitaxial semiconductor layer with concurrently doping impurity. Additionally, the word lines WL may be formed as a metal thin film.

In the peripheral circuit region, the second metal line M2 may be electrically connected to a driving device such as the second gate line 20, through a second gate contact 51. The second gate contact 51 electrically connects the second sub gate lines 21, 22. A second via structure 61 may be formed on the second gate contact 51, so that the second gate contact 51 and the second metal line M2 are electrically connected via the second via structure 61.

The second gate line 20 may be formed within a first interlayer insulating layer 200, the second gate contact 51 may be formed within a second interlayer insulating layer 210, the second via structure 61 may be formed within a third interlayer insulating layer 220, and the first and the second metal lines M1, M2 may be formed within a fourth interlayer insulating layer 230.

The first through the fourth interlayer insulating layers 200, 210, 220, 230 may be formed by using silicon oxide such as borosilicate glass (BSG), phosphosilicate glass (PSG), borophosphosilicate glass (BPSG), undoped silicate glass (USG), tetraethylorthosilicate glass (TEOS), or high density plasma-CVD.

Further, a barrier metal may be additionally formed between the second metal line M2 and the second via structure 61.

The first sub gate line 11 and the third sub gate line 32 may be electrically connected by the first metal line M1, thus realizing a semiconductor device having cross coupling node. The first sub gate line 12 and the third sub gate line 31 may be used as dummy gate lines, in which the first sub gate line 12 and the third sub gate line 31 may be dummy gate lines arranged opposite to each other with reference to the gate isolation region CR.

That is, dummy gate lines may be arranged opposite to each other with reference to the gate isolation region CR, according to the cross coupling node structure.

According to an exemplary embodiment, the first gate contact 50, the second gate contact 51, and the third gate contact 52 of the semiconductor device 1 may include copper (Cu) or tungsten (W), respectively.

For example, the first via structure 60, the second via structure 61, and the third via structure 62 may be formed from, for example, titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium, tungsten, molybdenum, tantalum, titanium silicide, tantalum silicide, graphite, or a combination thereof.

The first and the second metal lines M1, M2 may be formed in the peripheral circuit region when the bit lines BL are formed in the cell array region. The second gate contact 51, which connects the second metal line M2 and the second gate line 20, may be formed by patterning the second interlayer insulation layer 120 to form a contact hole, and then filling up the same with metal thin film. The second via structure 61 may be formed by patterning the third interlayer insulating layer 220 to form a contact hole, and then filling up the same with metal thin film.

Depending on cases, the second via structure 61 and the second metal line M2 may be formed by one single process. That is, the second via structure 61 and the second metal line M2 may be concurrently formed by patterning the third and the fourth interlayer insulation layers 230, 240 to form a contact hole, forming metal thin film on the contact hole and on the fourth interlayer insulation layer 240, and then patterning the same.

As illustrated, the first through fourth interlayer insulation layers 200, 210, 220, 230 may each be a single layer, but depending on an exemplary embodiment, each may be formed of several layers. Likewise, the first and the second metal lines M1, M2, the first through the third via structures 60, 61, 62, and the first through the third gate contacts 50, 51, 52 may each be a single layer, but in an alternative example, each may be formed of several layers. Further, the first and the second metal lines M1, M2 may be damascene type lines which are formed by the damascene process.

Hereinafter, a semiconductor device according to another exemplary embodiment will be explained.

Figure 6:
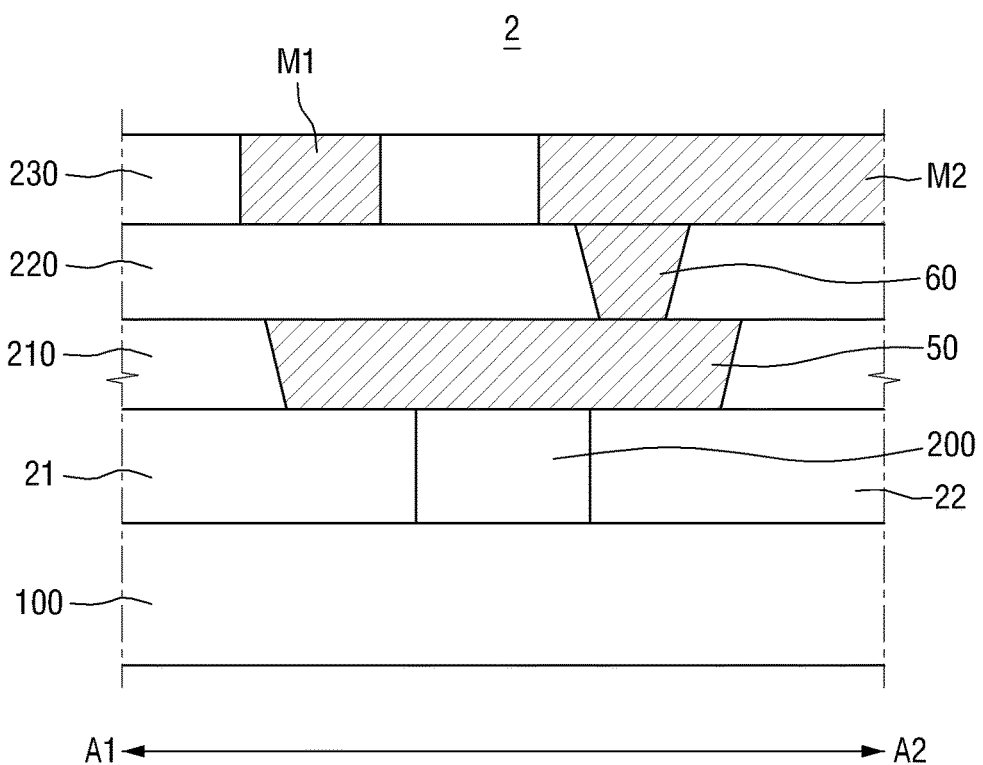
FIG. 6 is a cross section provided to explain a semiconductor device according to another exemplary embodiment.

FIG. 6 is a cross section provided to explain a semiconductor device according to another exemplary embodiment. For convenience of explanation, the like or substantially identical elements to those of the semiconductor device already explained above will not be redundantly explained below.

Referring to FIG. 6, the semiconductor device 2 according to another exemplary embodiment includes a first interlayer insulation layer 200 arranged between the second sub gate lines 21, 22.

That is, a lower surface of the second gate contact 50 may be arranged higher than an upper surface of the second sub gate lines 21, 22. The second gate contact 50 may be formed after filling the first interlayer insulation layer 200 between the second sub gate lines 21, 22, by forming the second interlayer insulation layer 210 on the first interlayer insulation layer 200 and the second sub gate lines 21, 22, etching the second interlayer insulation layer 210 so as to form a contact hole, and then filling the contact hole.

Accordingly, a lower surface of the second gate contact 50 may be arranged to be higher than an upper surface of the second sub gate lines 21, 22.

Figure 7:
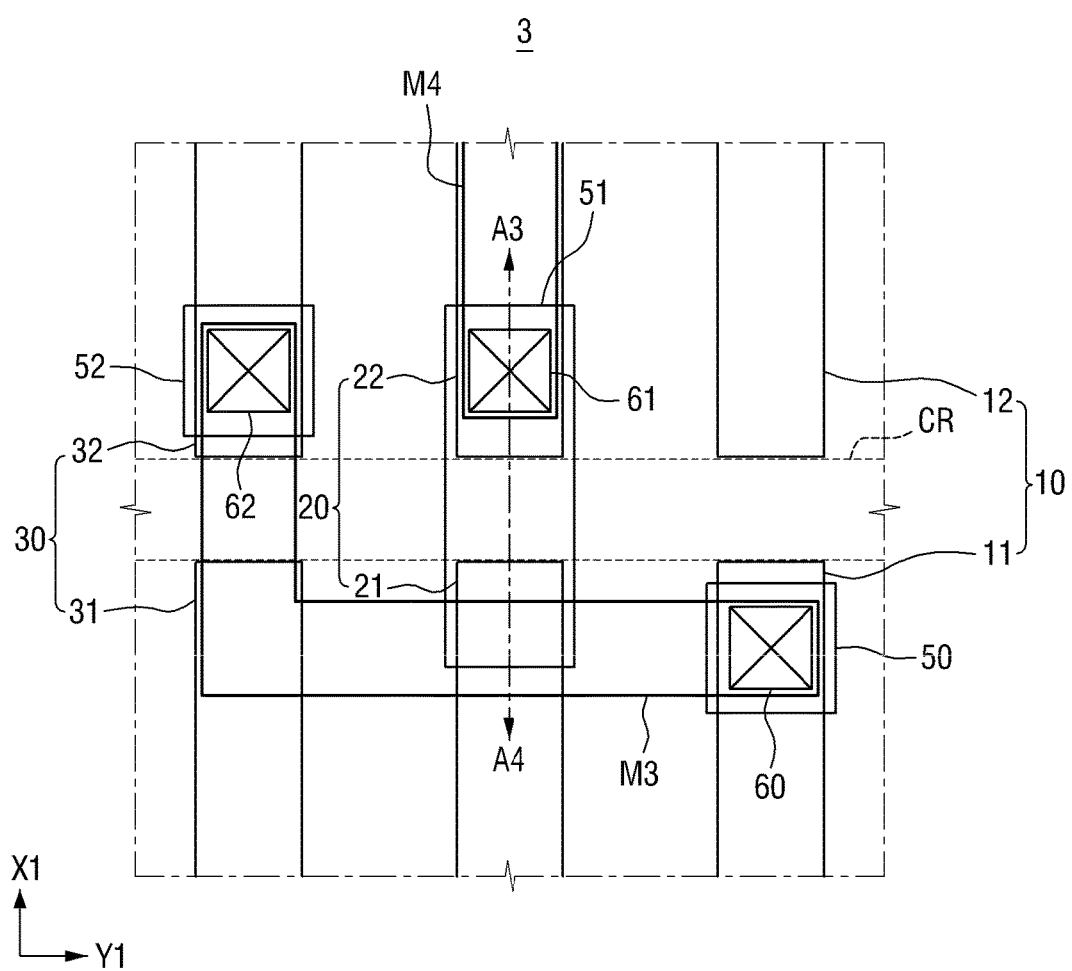
FIG. 7 is a layout provided to explain a semiconductor device according to another exemplary embodiment.
Figure 8:
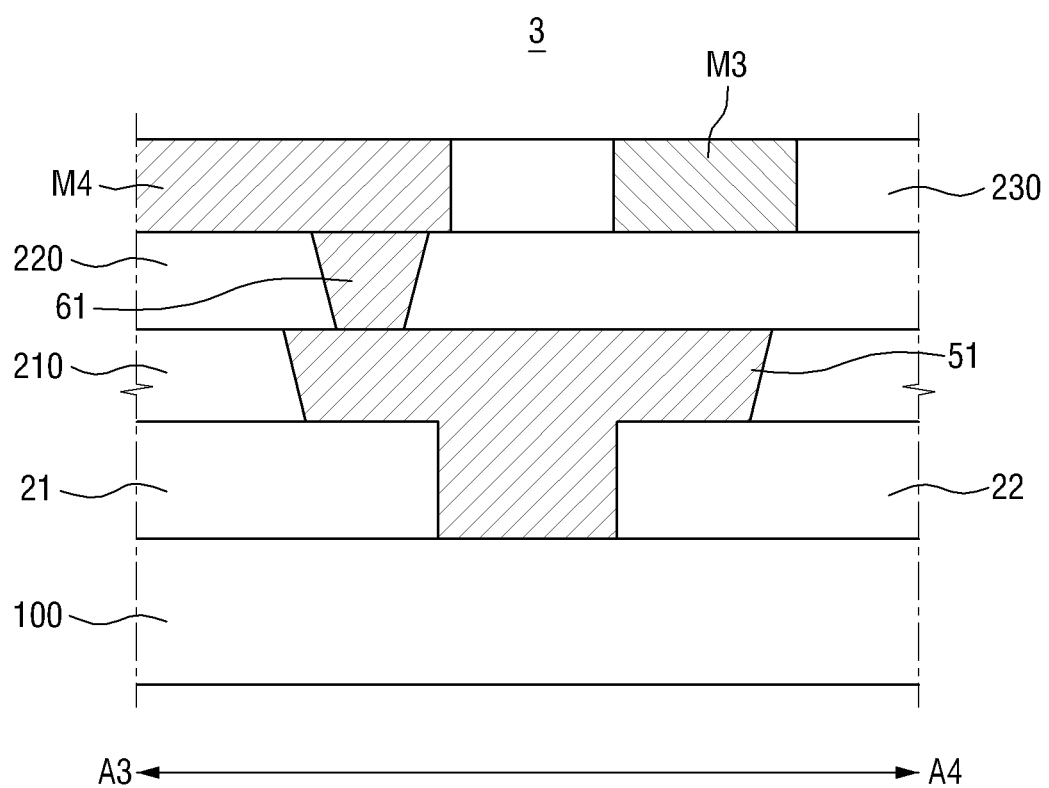
FIG. 8 is a cross section taken on line A3-A4 of FIG. 7.

FIG. 7 is a layout provided to explain a semiconductor device according to another exemplary embodiment. FIG. 8 is a cross section taken on line A3-A4 of FIG. 7. For convenience of explanation, the like or substantially identical elements to those of the semiconductor device already explained above will not be redundantly explained below.

Referring to FIGS. 7 and 8, according to yet another exemplary embodiment, the semiconductor device 3 may be realized as a semiconductor device having cross coupling node, in which the first sub gate line 11 and the third sub gate line 32 may be electrically connected by the third metal line M3. The first sub gate line 12 and the third sub gate line 31 may be used as dummy gate lines, in which the first sub gate line 12 and the third sub gate line 31 may be dummy gate lines arranged opposite to each other with reference to the gate isolation region CR.

That is, the semiconductor device 1 and the semiconductor device 3 may be arranged such that the first and the second metal lines M1, M2 and the third and fourth metal lines M3, M4 have point symmetry structure.

The first gate contact 50, the second gate contact 51, and the third gate contact 52 of the semiconductor device 3 may include copper (Cu) or tungsten (W), respectively.

For example, the first via structure 60, the second via structure 61, and the third via structure 62 may be formed from, for example, titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium, tungsten, molybdenum, tantalum, titanium silicide, tantalum silicide, graphite, or a combination thereof.

Referring to FIG. 8, the semiconductor device 3 may include the second via structure 61 formed on the second gate contact 51, and the second via structure 61 may be arranged on the second sub gate line 22. That is, in the semiconductor device 1, the second via structure 61 is formed on the second gate contact 51 and arranged on the second sub gate line 22, while in the semiconductor device 3, the second via structure 61 may be arranged on the second sub gate line 21 depending on process.

Figure 9:
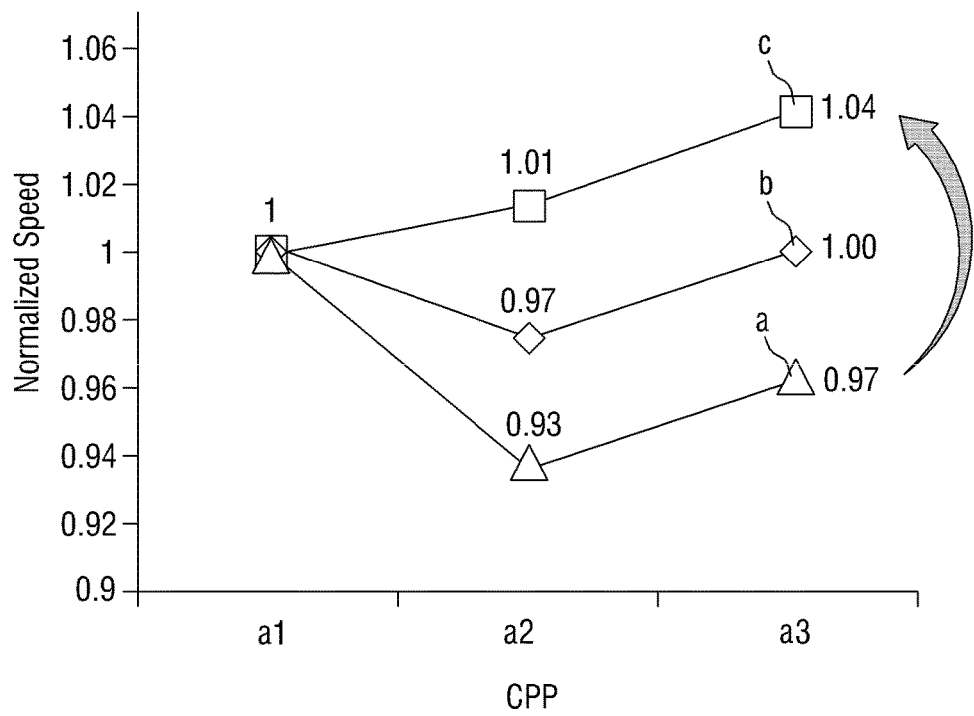
FIG. 9 is a graph provided to explain effects of semiconductor devices according to one or more exemplary embodiments.

FIG. 9 is a graph provided to explain an effect of a semiconductor device according to one or more exemplary embodiments.

Referring to FIG. 9, line (a) of the graph represents an operation speed of the semiconductor device when the cross coupling node structure is formed using one fin. Compared to line (b) representing target operation speed of the semiconductor device, performance degradation is noticeable.

Referring to line (c) of the graph representing the operation speed of the semiconductor device when the cross coupling node structure is formed using two fins, it is noted that the semiconductor device has improved performance.

Figure 10:
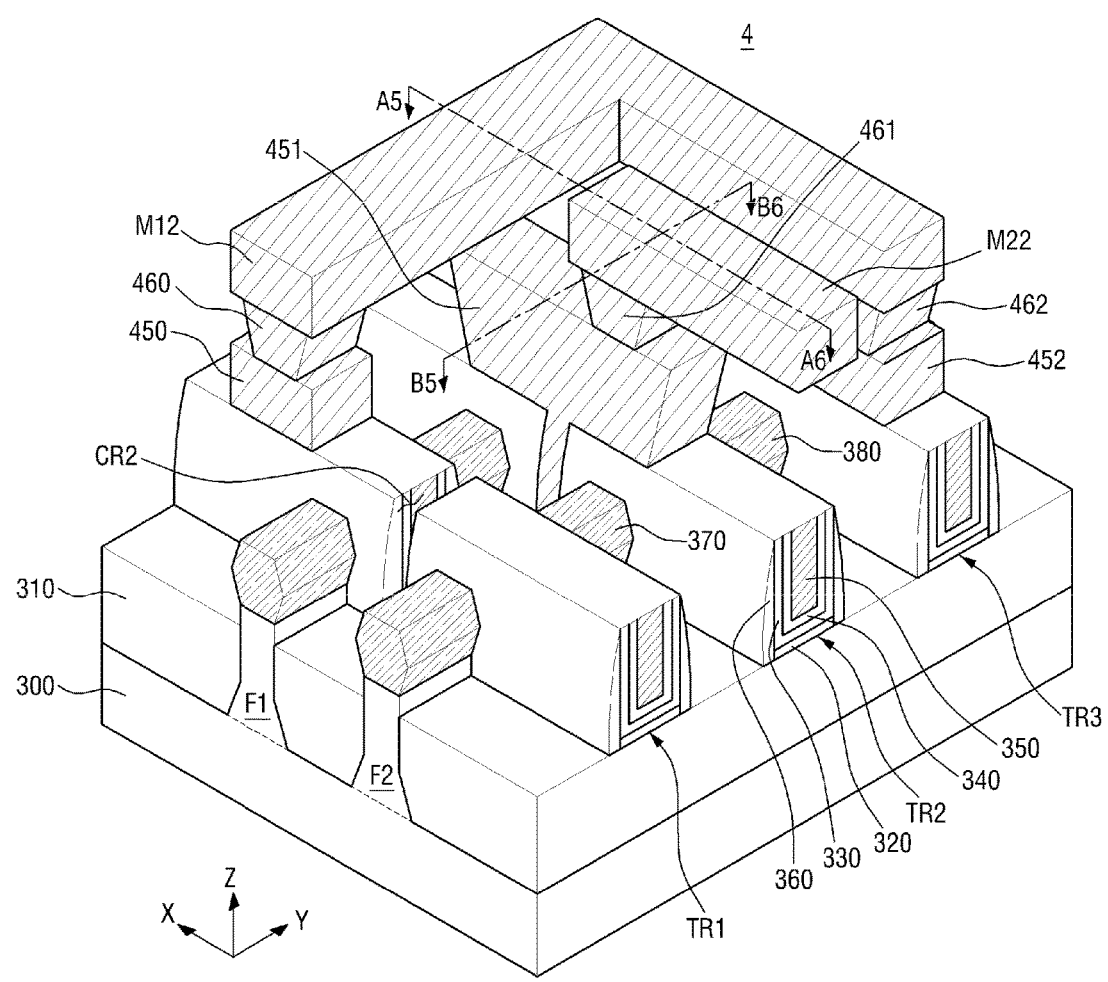
FIG. 10 is a perspective view provided to explain a semiconductor device according to yet another exemplary embodiment.
Figure 11:
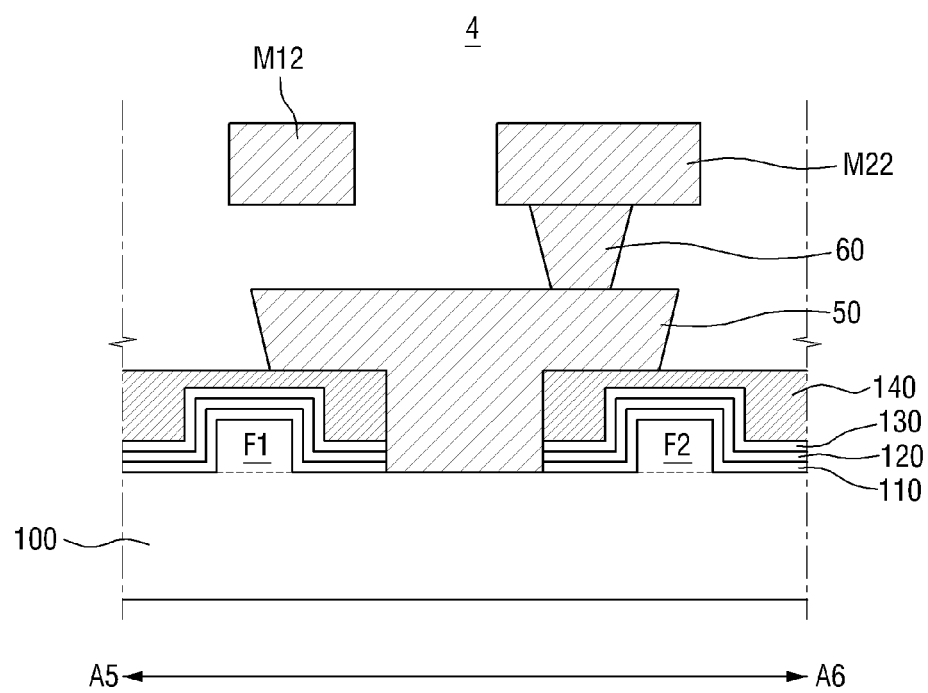
FIG. 11 is a cross section taken on line A5-A6 of FIG. 10.
Figure 12:
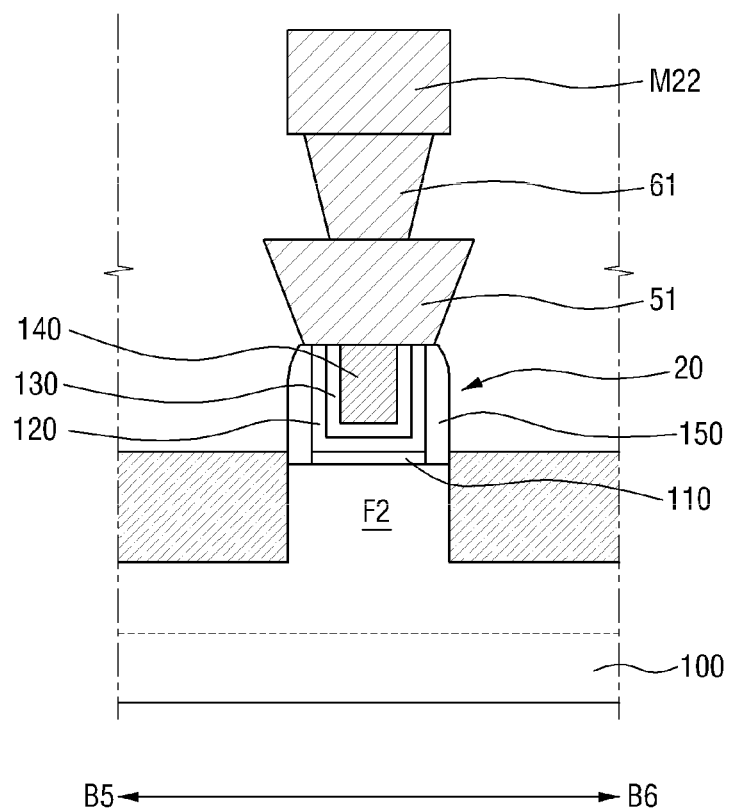
FIG. 12 is a cross section taken on line B5-B6 of FIG. 10.

FIG. 10 is a perspective view provided to explain a semiconductor device according to yet another exemplary embodiment; FIG. 11 is a cross section taken on line A5-A6 of FIG. 10. FIG. 12 is a cross section taken on line B5-B6 of FIG. 10. For convenience of explanation, the like or substantially identical elements to those of the semiconductor device explained above will not be redundantly explained below.

FIGS. 10 to 12 illustrate a FinFET structure semiconductor device 4. The semiconductor device 4 includes a substrate 300, a field insulation layer 310, a first active fin F1, a second active fin F2, a first through a third gate structures TR1~TR3, a gate isolation region CR2, a first gate contact 450, a second gate contact 451, a third gate contact 452, a first via structure 460, a second via structure 461, a third via structure 462, a fifth metal line M12, and a sixth metal line M22.

The substrate 300 may be a rigid substrate such as silicon substrate, silicon on insulator (SOI) substrate, gallium arsenide substrate, silicon germanium substrate, ceramic substrate, quartz substrate or glass substrate for display, or a flexible substrate such as polyimide, polyester, polycarbonate, polyethersulfone, polymethyl methacrylate, polyethylene naphthalate, or polyethylene terephthalate.

The field insulation layer 310 is formed on the substrate 300 and used for device separation. The field insulation layer 310 is an insulation layer, and may be an HDP oxidation layer, an SOG oxidation layer, or a CVD oxidation layer, but not limited thereto.

The first active fin F1 and the second active fin F2 are formed on the substrate 300. In particular, the first active fin F1 and the second active fin F2 may protrude from the substrate 300. The first active fin F1 and the second active fin F2 may be formed on the substrate 300 by a separate process, or may be a part of the substrate 300.

The first active fin F1 and the second active fin F2 may be extended along a second direction Y. The field insulation layer 310 may cover an upper surface of the substrate 300 and part of side surfaces of the first and the second active fins F1, F2.

The first through the third gate structures TR1~TR3 may be formed on the first active fin F1 and the second active fin F2 in a direction crossing the first and the second active fins F1, F2. That is, the first through the third gate structures TR1~TR3 may be elongated along a first direction X.

The first through the third gate structures TR1~TR3 include substantially the same configuration. The first through the third gate structures TR1~TR3 have a structure that is cut by the gate isolation region CR2. The gate isolation region CR2 is so formed that it extends to a second direction Y, and cuts the first through the third gate structures TR1~TR3.

Referring to FIG. 10, the second gate structure TR2 will be explained. The second gate structure TR2 will be representatively explained herein, since the first gate structure TR1 and the third gate structure TR3 have substantially the same configuration as the second gate structure TR2.

The second gate structure TR2 may include an interface layer 320, a gate insulation layer 330, a workfunction adjustment layer 340, a gate metal 350, a gate spacer 360, or the like, which are formed sequentially on the first active fin F1 and the second active fin F2. The above structure may form a channel in both side surfaces and upper surfaces of the first active fin F1 and the second active fin F2.

The interface layer 320 may be formed on the field insulation layer 310, and on the first and the second active fins F1, F2. The interface layer 320 may play a role of preventing interface defect between the field insulation layer 310 and the gate insulation layer 330.

The interface layer 320 may include low-k dielectric material layer having a dielectric constant (k) of 9 or below, such as, for example, silicon oxide layer (where, k is approximately 4) or a silicon oxynitride layer (depending on oxygen atom and nitrogen atom contents, k is approximately 4~8). Further, the interface layer 320 may be formed from silicate, and may be formed of a combination of the layers exemplified above.

The gate insulation layer 330 may be formed on the interface layer 320. If the interface layer 320 is not present, the gate insulation layer 330 may be formed on the field insulation layer 310 and the first and the second active fins F1, F2.

The gate insulation layer 330 may include a high-k material. Specifically, the gate insulation layer 330 may include any one selected from the group comprising of HfSiON, $HfO_2$, $ZrO_2$, $Ta_2O_5$, $TiO_2$, $SrTiO_3$, $BaTiO_3$, and $SrTiO_3$, for example.

The gate insulation layer 330 may be formed with a suitable thickness according to a type of device desired to be formed. For example, if the gate insulation layer 330 is $HfO_2$, the gate insulation layer 330 may be formed with a thickness of about 50 Å or below (between about 5 Å and 50 Å), but not limited thereto. The gate insulation layer 330 may be extended upward along a sidewall of the gate spacer 360 which will be explained below.

The workfunction adjustment layer 340 may be formed on the gate insulation layer 330. The workfunction adjustment layer 340 may be formed in contact with the gate insulation layer 330. The workfunction adjustment layer 340 is used for the adjustment of workfunction.

The workfunction adjustment layer 340 may include a metal nitride, for example. Specifically, the workfunction adjustment layer 340 may include at least one of Mo, Pd, Ru, Pt, TiN, WN, TaN, Ir, TaC, RuN, TiAl, TaAlC, TiAlN, and MoN. To be more specific, the workfunction adjustment layer 340 may be formed as a single layer comprising of TiN, or a double layer comprising of a TiN lower layer and a TaN upper layer, but not limited thereto.

The workfunction adjustment layer 340 may also be extended along the sidewall of the gate spacer 360 to an upward direction.

The gate metal 350 may be formed on the workfunction adjustment layer 340. The gate metal 350 may be formed in contact with the workfunction adjustment layer 340, as illustrated. That is, the gate metal 350 may be formed so as to fill a space generated by the workfunction adjustment layer 340. The gate metal 350 may include conductive material such as tungsten (W) or aluminum (Al), but not limited thereto.

The gate spacer 360 may be formed on at least one side of side surfaces of the second gate structure TR2. The gate spacer 360 may include at least one of nitride layer, oxynitride layer, and low-k material.

Further, although one side surface of the gate spacer 360 is illustrated as a curved line, exemplary embodiments are not limited to this example only. Accordingly, the shape of the gate spacer 360 may vary. For example, differently from the illustration, the shape of the gate spacer 360 may be I-shaped or L-shaped, for example.

As illustrated in the drawings, the gate spacer 360 may also be formed of a single layer, but not limited thereto. Accordingly, the gate spacer 150 may be formed of a plurality of layers.

The source or the drain 370, 380 may be formed on at least one side of both sides of the second gate structure TR2, and may be formed within the first and the second active fins F1, F2. The source or the drain 370, 380 and the second gate structure TR2 may be insulated by the gate spacer 360.

The sixth metal line M22 may be electrically connected to a driving device, e.g., the second gate structure TR2 via the seventh gate contact 451. The seventh gate contact 451 electrically connects the cut second gate structure TR2, and a seventh via structure 461 may be formed on the seventh gate contact 451 so that the seventh gate contact 451 and the sixth metal line M22 are electrically connected via the seventh via structure 461.

The cut first and third gate structures TR1, TR3 may be electrically connected by the fifth metal line M12, and realize a semiconductor device having cross coupling node. Part of the first gate structure TR1 and part of the third gate structure TR3 may be used as dummy gate structures, and these dummy gate structures may be arranged opposite to each other with reference to the gate isolation region CR2.

According to an exemplary embodiment, the sixth gate contact 450, the seventh gate contact 451, and the eighth gate contact 452 of the semiconductor device 4 may include copper (Cu) or tungsten (W), respectively. Further, the sixth gate contact 450, the seventh gate contact 451, and the eighth gate contact 452 may be arranged on the same plane with each other.

Further, the sixth via structure 460, the seventh via structure 461, and the eighth via structure 462 may be formed from, for example, titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON), tantalum oxynitride (TaON), titanium, tungsten, molybdenum, tantalum, titanium silicide, tantalum silicide, graphite, or a combination thereof.

Further, the sixth via structure 460, the seventh via structure 461, and the eighth via structure 462 may be arranged on the same plane with each other.

Figure 13:
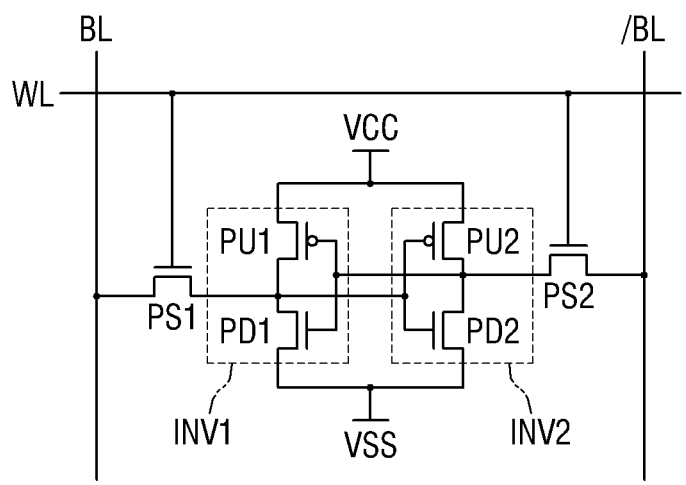
FIGS. 13 to 15 are a circuit diagram and layouts provided to explain a semiconductor device according to yet another exemplary embodiment.
Figure 14:
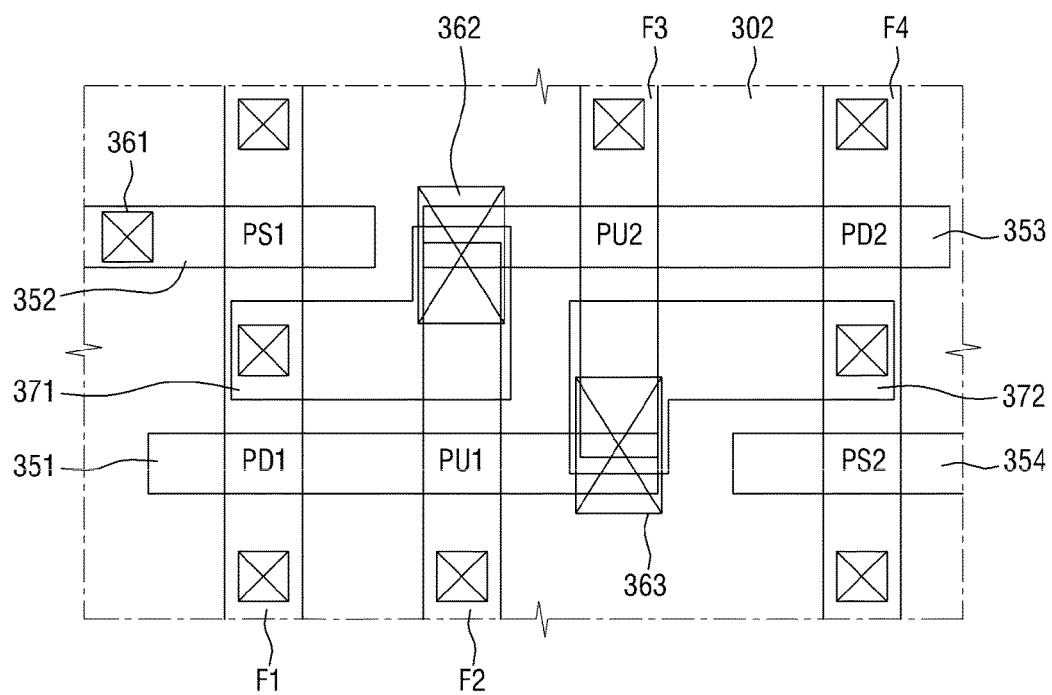
Figure 15:
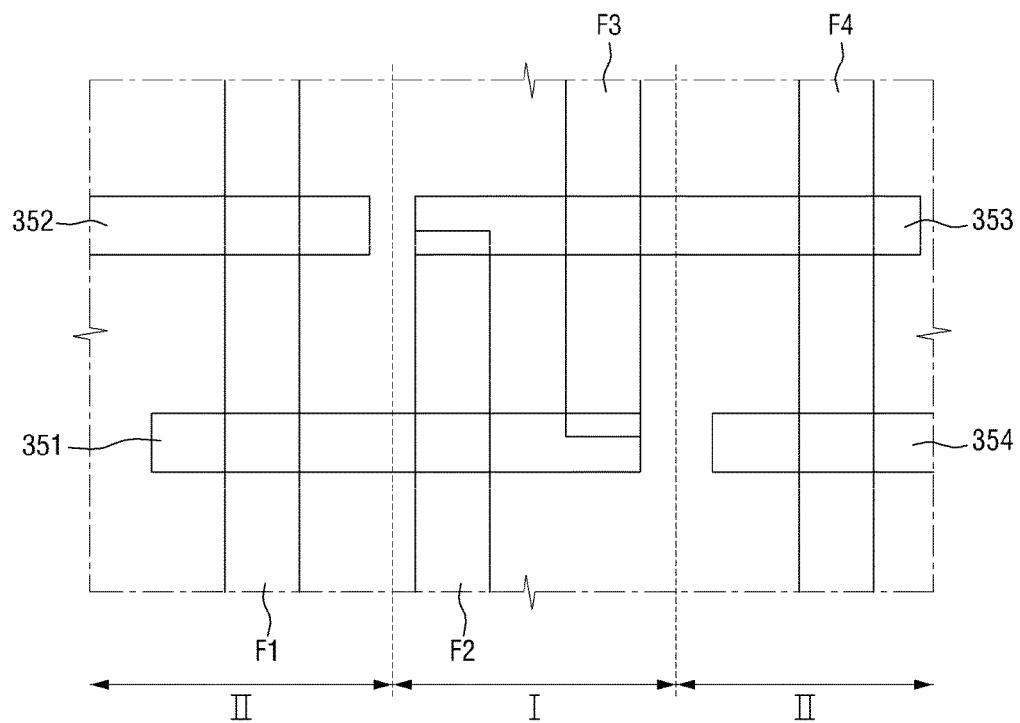

FIGS. 13 to 15 are a circuit diagram and layouts provided to explain a semiconductor device according to yet another exemplary embodiment.

FIG. 15 illustrates a plurality of fins and a plurality of gate structures only, from the layout of FIG. 14. While the semiconductor devices according to one or more exemplary embodiments explained above may be applied to all the devices comprising of general logic devices using fin-type transistors, FIGS. 13 through 15 particularly exemplify SRAM.

Referring first to FIG. 13, a semiconductor device according to yet another exemplary embodiment may include a pair of inverters INV1, INV2 connected in parallel between a power node Vcc and a ground node Vss, and a first pass transistor PS1 and a second pass transistor PS2 connected to output nodes of the respective inverters INV1, INV2.

The first pass transistor PS1 and the second pass transistor PS2 may be connected to a bit line BL and a complementary bit line /BL, respectively. The gates of the first pass transistor PS1 and the second pass transistor PS2 may be connected to a word line WL.

The first inverter INV1 includes a first pull-up transistor PU1 and a first pull-down transistor PD1 connected in series with each other, and the second inverter INV2 includes a second pull-up transistor PU2 and a second pull-down transistor PD2 connected in series with each other.

The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 may build up one latch circuit, when an input node of the first inverter INV1 is connected to an output node of the second inverter INV2 and an input node of the second inverter INV2 is connected to an output node of the first inverter INV1.

Referring to FIGS. 13 through 15, the first active fin F1, the second active fin F2, the third active fin F3 and the fourth active fin F4 spaced from each other may be elongated in one direction (e.g., vertical direction in FIG. 12).

Further, the first gate structure 351, the second gate structure 352, the third gate structure 353 and the fourth gate structure 354 may be elongated in the other direction (e.g., horizontal direction in FIG. 12), and in a direction crossing the first through fourth active fins (F1~F4).

Specifically, the first gate structure 351 may be so configured as to be completely across the first active fin F1 and the second active fin F2, and be overlapped with a portion of an end of the third active fin F3. The third gate structure 353 may be so configured as to be completely across the fourth active fin F4 and the third active fin F3, and be overlapped with a portion of an end of the second active fin F2. The second gate structure 352, and the fourth gate structure 354 may each be formed across the first active fin F1 and the fourth active fin F4, respectively.

As illustrated in the semiconductor device 302 of FIG. 14, the first pull-up transistor PU1 is defined in a perimeter of an intersection area between the first gate structure 351 and the second active fin F2, the first pull-down transistor PD1 is defined in a perimeter of an intersection area between the first gate structure 351 and the first active fin F1, and the first pass transistor PS1 is defined in a perimeter of an intersection area between the second gate structure 352 and the first active fin F1.

The second pull-up transistor PU2 is defined in a perimeter of an intersection area between the third gate structure 353 and the third active fin F3, the second pull-down transistor PD2 is defined in a perimeter of an intersection area between the third gate structure 353 and the fourth active fin F4, and the second pass transistor PS2 is defined in a perimeter of an intersection area between the fourth gate structure 354 and the fourth active fin F4.

Although not specifically illustrated, recesses may be formed on both sides of the intersection areas between the first through the fourth gate structures 351~354 and the first through the fourth active fins F1~F4, and the source or drain region may be formed in the recesses, with a plurality of contacts 361 formed.

Moreover, the shared contact 362 simultaneously connects the second active fin F2, the third gate structure 353 and the line 371. The shared contact 363 simultaneously connects the third active fin F3, the first gate structure 351 and the line 372.

The semiconductor devices according to the exemplary embodiments explained above may be employed as the first pull-up transistor PU1, the first pull-down transistor PD1, the first pass transistor PS1, the second pull-up transistor PU2, the second pull-down transistor PD2, and the second pass transistor PS2, for example.

An electronic system comprising a semiconductor device according to one or more exemplary embodiments will be explained below.

Figure 16:
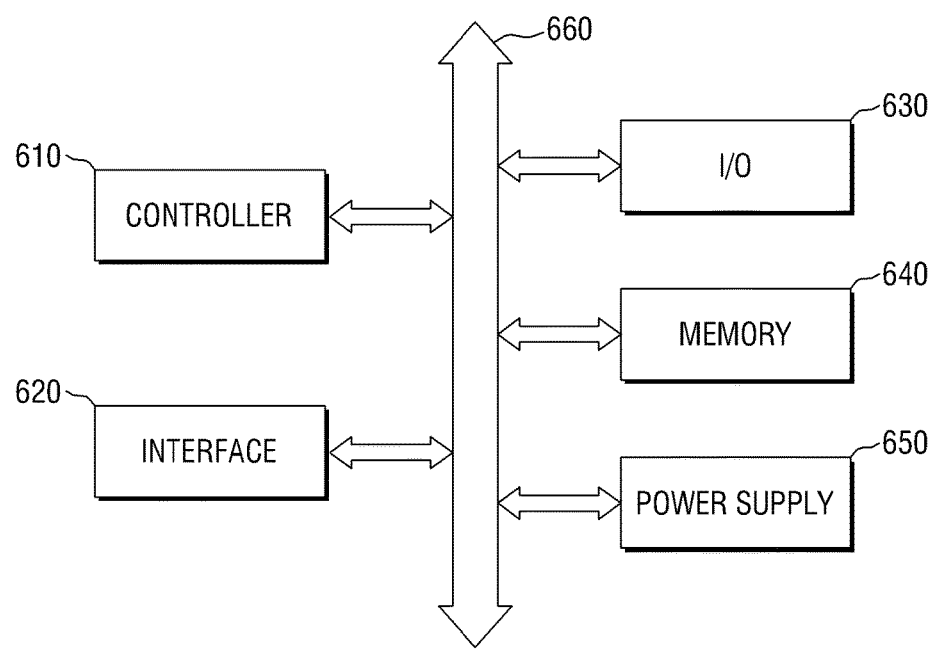
FIG. 16 is an overall block diagram provided to explain an electronic system comprising semiconductor devices according to one or more exemplary embodiments.

FIG. 16 is an overall block diagram provided to explain an electronic system comprising semiconductor devices according to one or more exemplary embodiments.

Referring to FIG. 16, the electronic system may include a controller 610, an interface 620, an input/output (I/O) device 630, a memory device 640, a power supply 650, and a bus 660.

The controller 610, the interface 620, the I/O device 630, the memory device 640, and the power supply 650 may be connected with each other via a bus 660. The bus 660 corresponds to a path where the data travels.

The controller 610 may include at least one of microprocessors, micro-controllers or logic devices that are capable of performing similar function as those exemplified above, to process the data.

The interface 620 may perform a function of transmitting data to a communication network or receiving data from the communication network. The interface 620 may be a wired or wireless form. For example, the interface 620 may include an antenna or a wired/wireless transceiver.

The I/O device 630 may include a keypad and a display to input and output data.

The memory device 640 may store data and/or commands. According to one or more exemplary embodiments of the present disclosure, the semiconductor device may be provided as part of constituent elements of the memory device 640.

The power supply 650 may convert externally-provided power, and provide the converted power to the respective constituent elements 610~640.

Further, the electronic system comprising semiconductor devices according to one or more exemplary embodiments of the present disclosure may include a central processing unit (CPU) 710, an interface 720, a peripheral device 730, a main memory device 740, a secondary memory device 750, and a bus 760.

The CPU 710, the interface 720, the peripheral device 730, the main memory device 740, and the secondary memory device 750 may be connected with each other via the bus 760. The bus 760 corresponds to a path where the data travels.

The CPU 710 may include a controller, an arithmetic logic unit (ALU), etc. to execute programs and process data.

The interface 720 may perform a function of transmitting data to a communication network or receiving data from the communication network. The interface 520 may be a wired or wireless form. For example, the interface 520 may include an antenna or a wired/wireless transceiver.

The peripheral device 730 may include a mouse, a keyboard, a display, and a printer to input and output data.

The main memory device 740 may transmit and receive data to and from the CPU 710, and store data and/or commands necessary for the execution of the program. According to one or more exemplary embodiments of the present disclosure, the semiconductor device may be provided as part of constituent elements of the main memory device 740.

The secondary memory device 750 may include a non-volatile storage such as a magnetic tape, a magnetic disc, a floppy disc, a hard disk, or an optical disk, to store data and/or commands. The secondary memory device 750 may retain the data even when the power to the electronic system is cut off.

At least one of the semiconductor devices according to the exemplary embodiments of the present disclosure may be adapted for use in a tablet PC, a laptop computer, or a smartphone.

Further, it would be obvious to those skilled in the art that the semiconductors according to one or more exemplary embodiments of the present disclosure are applicable to other semiconductor systems although such are not exemplified herein. That is, while the tablet PC, the laptop computer and the smartphone are exemplified herein to explain the semiconductor system according to exemplary embodiments of the present disclosure, the present disclosure is not limited to certain examples of the semiconductor system according to the exemplary embodiments provided herein. In one or more exemplary embodiments of the present disclosure, the semiconductor system may be implemented as a computer, an ultra-mobile PC (UMPC), a workstation, a netbook, personal digital assistants (PDA), a portable computer, a wireless phone, a mobile phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, or a digital video player.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present exemplary embodiments be considered in all respects as illustrative and not restrictive, reference being made to the appended claims rather than the foregoing description to indicate the scope of the inventive concept.

What is claimed is:

1. A system on chip (SoC) comprising:
   a substrate;
   a first gate line, a second gate line, a third gate line, a fourth gate line, a fifth gate line and a sixth gate line disposed on the substrate and extending in a first direction, the third gate line being disposed between the first gate line and the fifth gate line, the fourth gate line being disposed between the second gate line and the sixth gate line;
   a gate isolation region extending in a second direction different from the first direction, disposed between the first gate line and the second gate line, disposed between the third gate line and the fourth gate line, and disposed between the fifth gate line and the sixth gate line;
   a first gate contact disposed either on the first gate line or on the second gate line;
   a second gate contact disposed both on the third gate line and on the fourth gate line, and electrically connecting the third gate line and the fourth gate line;
   a third gate contact disposed either on the fifth gate line or on the sixth gate line;
   a first metal line electrically connecting the first gate contact and the third gate contact; and
   a second metal line electrically connected to the second gate contact.

2. The SoC of claim 1, wherein the first direction is perpendicular to the second direction.

3. The SoC of claim 1, wherein the first gate line and the second gate line are arranged along a first imaginary line,
   the third gate line and the fourth gate line are arranged along a second imaginary line, and
   the fifth gate line and the sixth gate line are arranged along a third imaginary line.

4. The SoC of claim 1, wherein the first gate contact is disposed on the first gate line,
   the third gate contact is disposed on the sixth gate line, and
   the second gate line and the fifth gate line are dummy gate lines.

5. The SoC of claim 4, wherein the second gate line is arranged opposite to the fifth gate line with respect to the gate isolation region.

6. The SoC of claim 1, further comprising:
   a first via disposed on the first gate contact;
   a second via disposed on the second gate contact, and electrically connecting the second gate contact and the second metal line; and
   a third via disposed on the third gate contact.

7. The SoC of claim 6, wherein the first metal line is arranged on the first via and the third via, and electrically connects the first gate contact and the third gate contact, and
   the second metal line is arranged on the second via.

8. The SoC of claim 1, wherein the first gate contact, the second gate contact and the third gate contact are arranged on the same plane.

9. The SoC of claim 1, wherein the first gate contact includes a copper (Cu) or a tungsten (W).

10. A system on chip (SoC) comprising:
    a substrate;
    a first gate line and a second gate line disposed on the substrate and extending in a first direction;
    a gate isolation region extending in a second direction different from the first direction, and disposed between the first gate line and the second gate line;
    a gate contact disposed both on the first gate line and on the second gate line, and electrically connecting the first gate line and the second gate line; and
    a metal line electrically connected to the gate contact.

11. The SoC of claim 10, wherein the first direction is perpendicular to the second direction.

12. The SoC of claim 10, further comprising a via disposed on the gate contact.

13. The SoC of claim 12, wherein the via electrically connects the gate contact and the metal line.

14. The SoC of claim 12, wherein the metal line is arranged on the via.

15. The SoC of claim 10, wherein the gate contact includes a copper (Cu) or a tungsten (W).

* * * * *